United States Patent

Lin et al.

[11] Patent Number: 5,982,044
[45] Date of Patent: Nov. 9, 1999

[54] ALIGNMENT PATTERN AND ALGORITHM FOR PHOTOLITHOGRAPHIC ALIGNMENT MARKS ON SEMICONDUCTOR SUBSTRATES

[75] Inventors: Hua-Tai Lin, Yueng-Kang; Gwo-Yuh Shiau, Hsinchu; Pin-Ting Wang, Taichung, all of Taiwan

[73] Assignee: Vanguard International Semiconductor Corporation, Hsin-Chu, Taiwan

[21] Appl. No.: 09/066,013

[22] Filed: Apr. 24, 1998

[51] Int. Cl.⁶ .................................................. H01L 23/544
[52] U.S. Cl. ................. 257/797; 438/401; 148/DIG. 102
[58] Field of Search .................................... 438/401, 462, 438/942–946; 148/DIG. 102; 257/282–283, 797

[56] References Cited

U.S. PATENT DOCUMENTS

| | | | |
|---|---|---|---|
| 4,343,878 | 8/1982 | Chiang | 430/5 |
| 4,590,382 | 5/1986 | Tabata | 250/491.1 |
| 4,679,942 | 7/1987 | Suwa et al. | 356/401 |
| 5,365,072 | 11/1994 | Turner et al. | 250/491.1 |
| 5,503,962 | 4/1996 | Caldwell | 430/317 |
| 5,643,801 | 7/1997 | Ishihara et al. | 437/7 |

*Primary Examiner*—Jey Tsai
*Attorney, Agent, or Firm*—George O. Saile; Stephen B. Ackerman

[57] ABSTRACT

Novel triangular alignment marks and a novel algorithm are used to provide improved global alignment of the substrate on a substrate stage in an align-and expose tool. The method provides an improved metrology for aligning to a recessed alignment mark in the substrate having a material layer, such as insulating, polysilicon, and conducting layers that are inadvertently made asymmetric by processing such as chemical/mechanically polishing. The method also employs an algorithm that detects the recessed edges of the triangle and mathematically generates three lines representing the edges of the triangle. The algorithm then generates a family of lines moving inward from the edges of the triangular alignment marks and parallel to the edges until the lines converge to a common point which determines the alignment center for the triangular alignment marks. The algorithm uses the coordinates of the alignment center to position the substrate in the exposure tool for a coarse alignment the photomask for exposing a photoresist layer on the substrate. This new alignment mark and new algorithm minimize misalignment due to asymmetric formation of a material layer over the alignment mark.

24 Claims, 3 Drawing Sheets

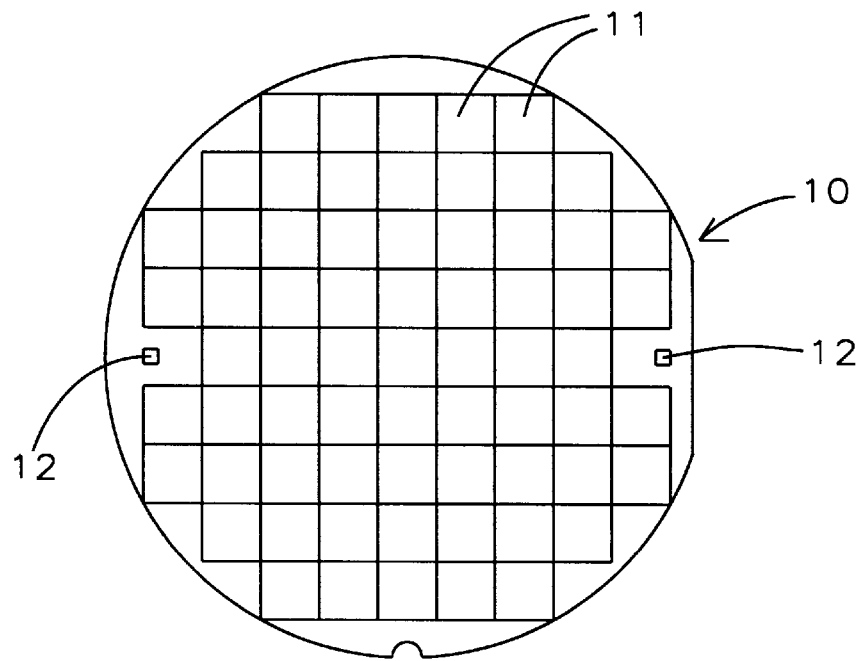
FIG. 1 – Prior Art
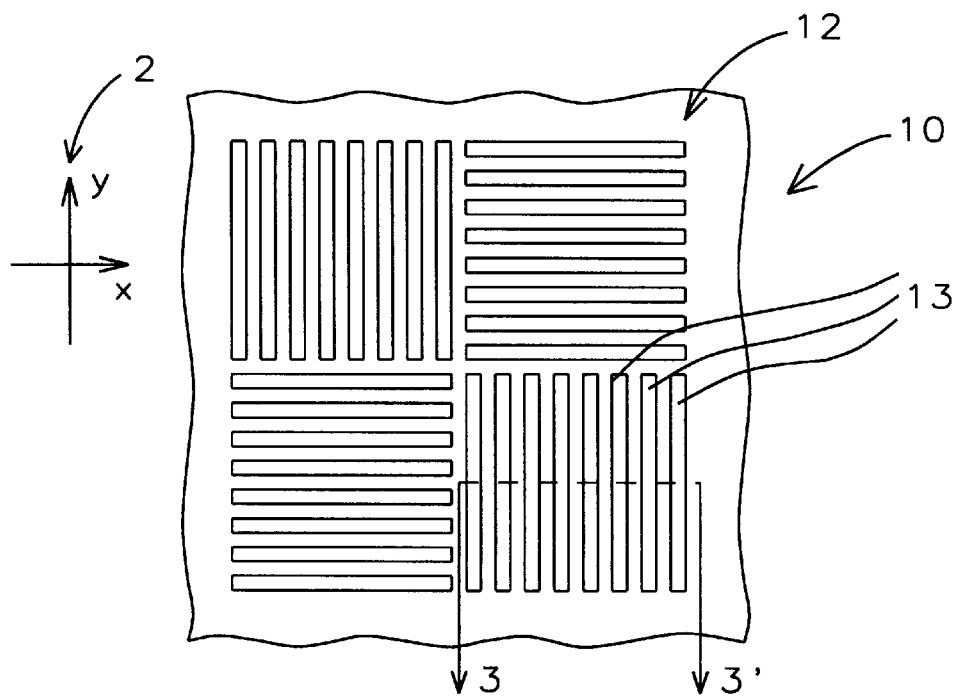
FIG. 2 – Prior Art

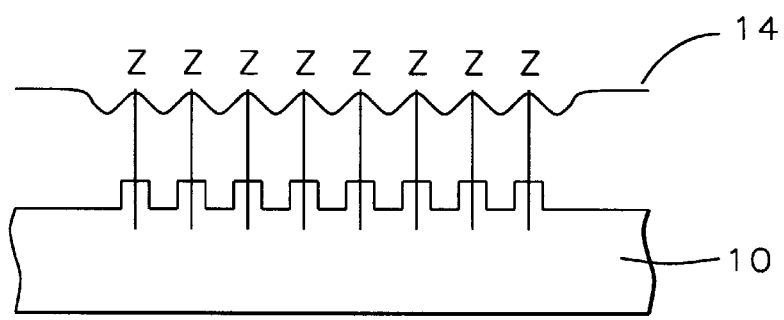
FIG. 3 - Prior Art
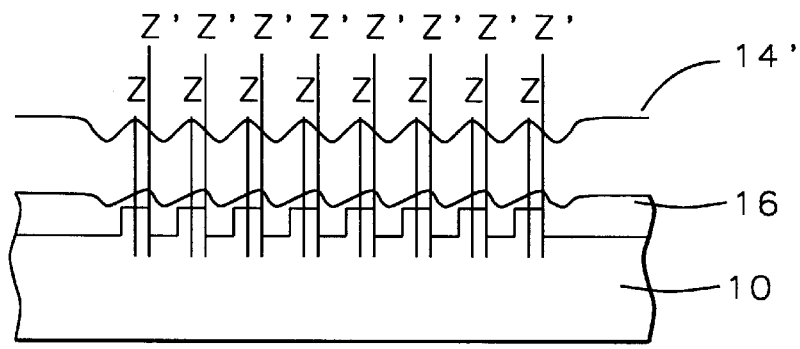
FIG. 4 - Prior Art
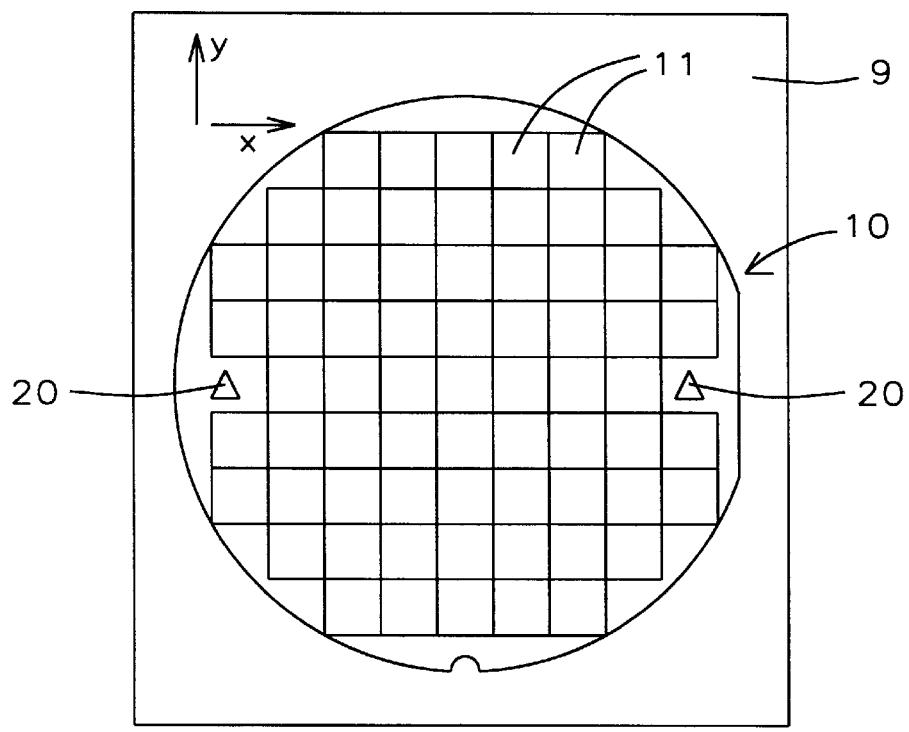
FIG. 5

ALIGNMENT PATTERN AND ALGORITHM FOR PHOTOLITHOGRAPHIC ALIGNMENT MARKS ON SEMICONDUCTOR SUBSTRATES

BACKGROUND OF THE INVENTION

(1) Field of the Invention

The present invention relates to semiconductor processing for integrated circuits, and more particularly relates to a method for achieving accurate alignment of photomasks or reticles using improved global alignment marks (keys) on a substrate and a novel alignment algorithm.

(2) Description of the Prior Art

Semiconductor processing for forming integrated circuits on substrates (wafers) requires a series of processing steps. These processing steps include the deposition and patterning of material layers such as insulating layers, polysilicon layers, and metal layers. The layers are typically patterned using a photoresist layer that is patterned over the material layer by exposing the photoresist through a photomask or reticle. The photoresist is then developed to provide the pattern. Typically the photomask or reticle has alignment marks (keys) that are aligned to alignment marks formed on the substrate at a previous processing step. However, as the integrated circuit feature sizes continue to decrease for increased circuit density, it becomes more difficult to register or align one masking level to the previous level. This is particularly difficult at submicrometer feature sizes when the overlay alignment tolerances are reduced. The overlay metrology problem is further exacerbated when the material layer has an asymmetric profile over the alignment mark on the substrate. This asymmetry can result during deposition, for example, during spin coating, or during planarization processing, such as by chemical/mechanical polishing (CMP). One area where this is of importance is for the coarse or global alignment marks on the perimeter of the substrate. This asymmetry results in distortion of the detection signal used by the software algorithm when aligning the substrate on the substrate stage to the photomask/reticle in an align and-expose tool, such as in a step-and-repeat exposure system.

At submicrometer feature sizes, the planar surface is required because of the need for a shallow depth of focus (DOF) to avoid resist image distortions. This planar surface is also necessary to prevent residue, such as stringers or rails, from forming on steep topographies that, for example, can cause electrical shorts between adjacent metal lines when the next material layer is patterned using directional plasma etching.

To better appreciate the aligning problem associated with the asymmetric alignment marks, a schematic top view of a substrate 10 having a prior-art two-point global alignment mark metrology is shown in FIG. 1. FIG. 1 also shows the array of chip areas or die areas 11 in which the integrated circuits are fabricated, and the positions of the two alignment marks 12 at the periphery of the substrate.

FIG. 2 shows a greatly enlarged top-view of one of the two prior art alignment marks 12. These alignment marks are typically comprised of several arrays of grooves 13 that are aligned along the x- and y-axes of a rectangular coordinate system 2 aligned with reference to the substrate stage.

Referring now to FIG. 3, a schematic cross-sectional view is shown through a portion 3–3' of the alignment mark in FIG. 2 after the grooves 13 are formed. For example, the grooves can be formed by recessing the substrate 10 using a previous etching step. Also shown in FIG. 3 is a typical optical detection signal 14 that the optical system on the aligner/exposure tool would detect prior to depositing the material layer commonly used in fabricating integrated circuits. The peak amplitudes in the detection signal are generally aligned over the grooves, as depicted by the vertical lines Z, and result in accurately determining the position of the alignment marks relative to the referenced x-y coordinates for the substrate stage. Unfortunately, as shown in FIG. 4, when the required material layer 16 is deposited and is asymmetric, the edge detection signal 14' is shifted to Z' and an error in alignment of (Z–Z') results that can exceed the alignment tolerance for the given product.

Several methods for making improved alignment marks and methods for aligning the substrate using these alignment marks have been reported. For example, in U.S. Pat. No. 4,343,878 to Chiang, an alignment method is described for making a series of square alignment marks, such as Box-in-Box marks that also generate used key pair blot marks that provide self-instructing mask alignment information.

Caldwell, in U.S. Pat. No. 5,503,962, teaches a method of forming an alignment mark in a planar layer when etching via holes in an insulating layer. Since the insulating layer is totally planarized over the alignment marks, it is not possible to align a mask for the next metal layer, which is opaque. Therefore, Caldwell provides recesses in the insulating layer during etching of the via holes to provide an alignment mark. In U.S. Pat. No. 5,643,801 to Ishihara et al., a laser anneal method is described which also includes two alignment marks on the substrate and two cameras for aligning the substrate before annealing. Still another method is described by Turner et al. in U.S. Pat. No. 5,365,072 for aligning a microscope in which concentric square, circular, or triangular alignment marks are used to reposition a microscope, such as an Atomic Force Microscope (AFM).

However none of the above methods addresses the need to accurately align a photomask or reticle over an alignment mark having an asymmetric material layer on the surface. There is still a need in the semiconductor industry to provide an improved alignment mark metrology using improved alignment marks and an algorithm that minimizes or prevents edge detection errors when a material layer resulting in an asymmetric profile is used.

SUMMARY OF THE INVENTION

It is therefore a principal object of this invention to provide triangular alignment marks on the periphery of a substrate for more accurate global alignment of the substrate to the photomask or reticle in an align-and-expose tool.

It is another object of this invention to provide an algorithm stored in permanent memory for aligning the triangular alignment marks on the substrate to the photomask in the align-and-exposure tool.

These objectives are accomplished by forming two triangular-shaped alignment marks on opposite sides of the principal surface of a substrate near the perimeter. A novel algorithm is then used to determine a center alignment point in the triangular alignment mark. Because the alignment mark structures and algorithm, by the method of this invention, are less sensitive to any error in the detection signal from the edge of the alignment mark when one of the material layers that is unintentionally deposited or CMPed having an asymmetric profile over the alignment mark edge, the method provides more accurate alignment than the prior-art method using the orthogonal arrays of grooves.

The method of this invention uses alignment marks that are preferably equilateral-triangular shaped and are formed by etching recesses in the substrate. An algorithm stored in permanent memory, which detects the three vertices of the triangular alignment marks, then generates (defines) lines parallel to the three edges of the triangular alignment mark. The algorithm then mathematically generates a series of lines equally spaced inward and parallel to the three originally generated lines until the intersection of the three innermost lines converges at a single point, which defines the center point of the alignment mark. The algorithm then aligns the substrate stage to this center point to provide the global alignment (or coarse) marks for aligning the substrate stage of the step-and-repeat exposure tool. The method is particularly useful for the initial coarse alignment of the substrate, but can also be used for the fine alignment when the mask/reticle is stepped across the substrate to expose the photoresist in the chip or die areas for fabricating the semiconductor integrated circuits. This would be achieved by providing similar alignment marks in the kerf or scribe areas between the chip areas and using a similar algorithm.

Since the initial generated lines are determined by the vertices of a triangular alignment mark, the error in determining the center alignment point is less dependent on any asymmetry in the material layers that may occur during processing.

BRIEF DESCRIPTION OF THE DRAWINGS

The objects and other advantages of this invention are best understood with reference to the preferred embodiment when read in conjunction with the following drawings.

FIG. 1 shows a schematic top view of a substrate having prior-art global alignment marks for a two-point global alignment.

FIG. 2 shows an enlarged schematic top view of one of the two global alignment marks comprised of an array of grooves along the x- and y-axes of the align and expose tool.

FIG. 3 shows a prior-art schematic cross-sectional view through a portion 3–3' of the alignment mark shown in FIG. 2 and a detection signal used to align the substrate in the step-and-repeat tool prior to forming a material layer on the substrate.

FIG. 4 shows a cross-sectional view of the same prior-art alignment mark of FIG. 3 after a material is formed having an asymmetric profile over the alignment mark, and also depicts the shift in the detection signal resulting in alignment error during the photo processing.

FIG. 5 shows a schematic top view of a substrate having two triangular-shaped global alignment marks used by the method of this invention to improve alignment accuracy.

DESCRIPTION OF THE PREFERRED EMBODIMENT

The method for making these improved triangular alignment marks and the alignment algorithm, by the method of this invention, is now described in detail with reference to FIGS. 5 and 6. These alignment marks can be used for both coarse and fine alignment on the substrate. Although these alignment marks are described for the global (or coarse) alignment of a substrate on a substrate stage to a photomask/reticle in a step-and-repeat tool, it should be well understood by those skilled in the art that similar triangular-shaped alignment marks and associated algorithms can also be used to align the fine alignment marks in the kerf or scribe areas between chip or die areas in which the integrated circuits are formed.

Referring more specifically to FIG. 5, the top view of a substrate having these alignment marks is shown. Typically the substrate 10 is a semiconductor substrate. For example, the substrate is typically a single-crystal silicon substrate. However, the method can be used on other types of substrates where accurate substrate alignment is required, such as silicon-on-insulator (SOI), gallium-arsenide and the like. The initial triangular global alignment marks 20 are formed first by etching recesses in the substrate. (Only the global alignment marks 20 are shown in FIG. 5.) For example, the recesses are formed as in the prior art (FIG. 3) but, important to this invention, the marks are triangular in shape rather than consisting of an array of grooves, as shown in FIG. 2. As shown in FIG. 5, the two triangular alignment marks 20 are typically formed near the edge of the substrate and are used to uniquely orient the substrate on the substrate stage 9 (along the x-y axes) to the photomask or reticle in the align-and-expose tool. The reticle is then automatically positioned over the chip areas 11 using a fine alignment in the kerf area between the chip areas. The reticle is then stepped across the wafer and the photoresist is exposed to generate the patterns necessary to fabricate the array of integrated circuits.

Figure 6:
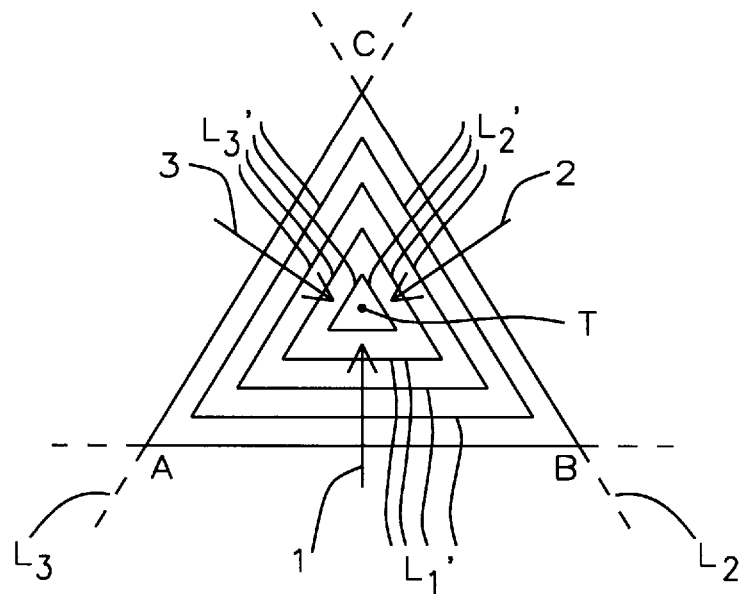
FIG. 6 shows an enlarged schematic top view of one of the two triangular-shaped global alignment marks used by the method of this invention depicting the series of converging lines toward a common point which is the center of the alignment mark.

Referring now to FIG. 6, a greatly enlarged top view of one of the triangular alignment marks is shown defined by the vertices A, B, and C. A novel algorithm (program), which is stored in permanent memory, is used by the align-and-expose tool to determine a center alignment point T in the triangular alignment mark. The algorithm generates lines L1, L2, and L3 parallel to the edges of the triangular alignment mark which also pass through the vertices A, B, and C, as shown in FIG. 6. The algorithm is then used to generate a series of lines L' that converge inward to intersect at a common point T as depicted by the arrows 1, 2, and 3, respectively, in FIG. 6. This common point defines the alignment coordinates for aligning the substrate stage to the photomask or reticle in the align-and-expose tool. Parameters measured f or the series of generated converging lines L' are sampled to determine when the common point T lies within specified alignment tolerances for the semiconductor fabrication process.

Figure 7:
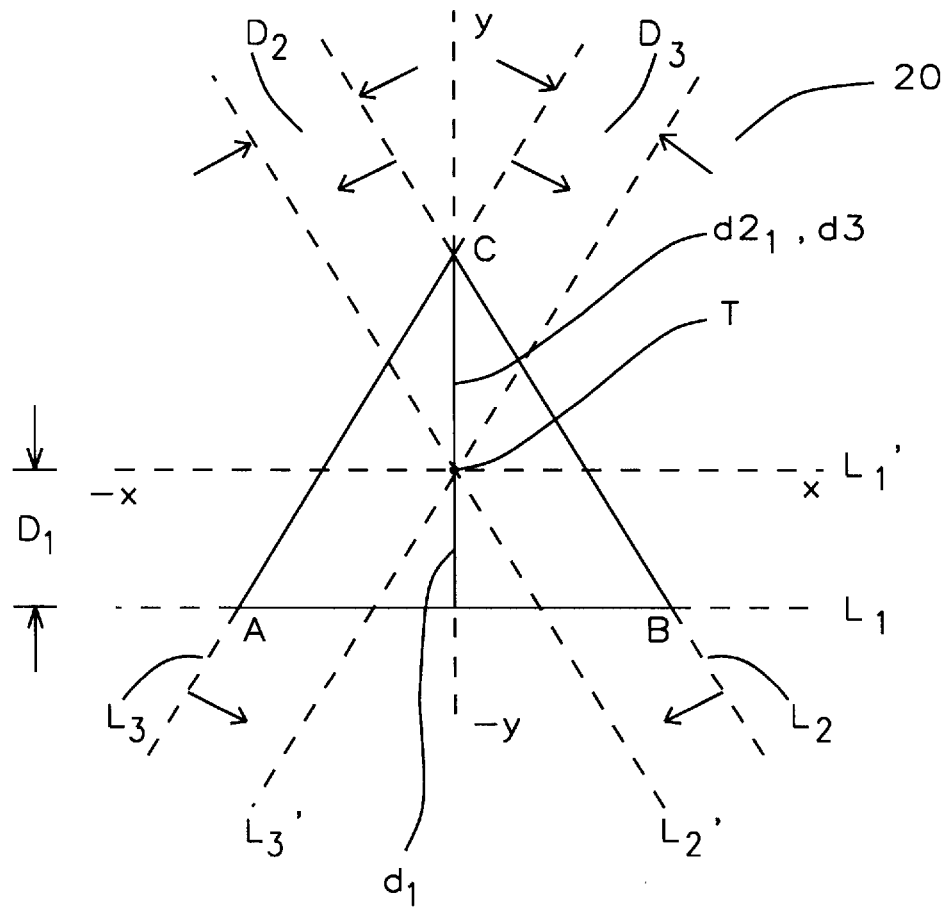
FIG. 7 shows the same enlarged schematic top view of one of the two triangular-shaped global alignment marks shown in FIG. 6, for describing in more detail how the novel algorithm mathematically determines the center point of the alignment mark on the substrate.

Referring next to FIG. 7, the algorithm for determining the alignment center T for the triangle 20 is described in more detail. The preferred triangle is an equilateral triangle having sides of equal length. The x-y rectangular coordinates are arbitrarily selected so that the origin (x=0, y=0) is at the common point T. The algorithm is used to mathematically define the lines L1, L2, and L3 along the edges of the triangular alignment mark and are expressed respectively by the equations $$y_1 = m_1 x_1 + d_1 \tag{1}$$

$$y_2 = m_2 x_2 + d_2 \tag{2}$$

$$y_3 = m_3 x_3 + d_3 \tag{3}$$

where m is the slope of each line, d is the projected distance along the y-axis when x is selected to be 0 in the above equations, and where x and y are the coordinates for each of the lines. The slopes m are determined as commonly defined in mathematics as the first derivative of the curve and are a constant for straight lines. The distance as measured normal (90°) to the lines L1, L2, and L3 of the triangle to the undetermined common point T are equal and represented in FIG. 7 by $D_1$, $D_2$, and $D_3$, respectively. Now the program generates a series of lines that converge inward until they intersect at the common point T, which serves as a center alignment point, as indicated in FIG. 7 by lines L1', L2', and L3'. The series of lines shown in FIG. 6 are not explicitly shown in FIG. 7 except for the lines that finally intersect at the common point T to simplify the drawing. As the lines converge toward the common point T, the distances $D_1$, $D_2$, and $D_3$ approach 0. Likewise the parameters $d_1$, $d_2$, and $d_3$ for the original lines L1, L2, and L3 defined by the above equations 1–3 represent the distances from the common point T along the y-axis to where the lines intersect the y-axis. These parameters also approach 0 as the lines move inward toward the common point T. The algorithm or program is also designed to sample the intersection of the converging lines to determine when the common point T is within a specified alignment tolerance for the product being fabricated. For example, one method for determining when the common point T is within the specified alignment tolerances is to calculate the length of the sides of the mathematically constructed triangle formed by the series of converging lines L1', L2', and L3' until the length of the sides is less than the required alignment tolerance, as depicted in FIG. 6.

The substrate stage is then positioned to align the determined center alignment point T on the substrate to a corresponding alignment mark on a photomask or reticle in the align-and-expose tool. The center alignment point T on the substrate is typically referred to as the setting point of a jobfile for every photoresist masking layer in the exposure tool. This invention improves the layer-by-layer overlay, which minimizes alignment error for asymmetric profiles of the alignment marks.

Since the invention uses a triangular alignment mark and a novel algorithm which defines lines over the edge of the triangular alignment mark and intersect the vertices, the alignment is less dependent on any material layer used on the substrate, having an asymmetric profile, formed over the alignment mark, and is an improvement over the prior art.

While the invention has been particularly shown and described with reference to the preferred embodiment thereof, it will be understood by those skilled in the art that various changes in form and detail may be made without departing from the spirit and scope of the invention.

What is claimed is:

1. A method for making novel alignment marks on a substrate and an algorithm for aligning said substrate to a photomask in a photoresist exposure tool comprising the steps of:

forming at least two said alignment marks triangular in shape recessed in said substrate near the perimeter;

said substrate having a material layer that can have an asymmetric profile over said recessed alignment marks;

forming a photoresist layer on said material layer;

providing said algorithm encoded in permanent memory for said exposure tool that detects the edges of said recessed triangular alignment marks and mathematically defines three lines parallel to said edges of said triangular alignment mark; and further, said algorithm generates a family of lines moving inward from said edges of said triangular alignment marks and parallel to said edges until said lines converge to a common point which determines the alignment center for said triangular alignment marks;

said algorithm then uses the coordinates of said alignment center to position said substrate in said exposure tool to said photomask for exposing said photoresist, wherein said alignment mark and said algorithm minimize misalignment due to asymmetric formation of said material layer over said alignment marks.

2. The method of claim 1, wherein said alignment marks recessed in said substrate have equilateral triangular shapes.

3. The method of claim 1, wherein said material layer is a polysilicon layer.

4. The method of claim 1, wherein said material layer is a conducting layer.

5. The method of claim 1, wherein said material layer is an insulating layer.

6. The method of claim 1, wherein said material layer is a chemically/mechanically polished layer that can result in asymmetric polishing resulting in misalignment between masking levels.

7. The method of claim 1, wherein said material layer is composed of any material used in the fabrication of semiconductor devices.

8. The method of claim 1, wherein said algorithm that generates said family of lines that converge to said common point, wherein said common point is within a required alignment tolerance.

9. The method of claim 1, wherein said permanent memory is a magnetic storage device.

10. The method of claim 1, wherein said photomask is also used to expose and develop said photoresist layer to form photoresist patterns for making semiconductor devices.

11. A method for making novel alignment marks on a substrate and an algorithm for aligning said substrate to a photomask in a photoresist exposure tool comprising the steps of:

forming at least two said alignment marks having equilateral triangular shapes recessed in said substrate near the perimeter;

said substrate having a material layer that can have an asymmetric profile over said recessed alignment marks;

forming a photoresist layer on said material layer;

providing said algorithm encoded in permanent memory for said exposure tool that detects the edges of said recessed triangular alignment marks and mathematically defines three lines parallel to said edges of said triangular alignment mark; and further, said algorithm generates a family of lines moving inward from said edges of said triangular alignment marks and parallel to said edges until said lines converge to a common point which determines the alignment center for said triangular alignment marks;

said algorithm then uses the coordinates of said alignment center to position said substrate in said exposure tool to said photomask for exposing said photoresist, wherein said alignment mark and said algorithm minimize misalignment due to asymmetric formation of said material layer over said alignment marks.

12. The method of claim 11, wherein said material layer is a polysilicon layer.

13. The method of claim 11, wherein said material layer is a conducting layer.

14. The method of claim 11, wherein said material layer is an insulating layer.

15. The method of claim 11, wherein said material layer is a chemically/mechanically polished layer that can result in asymmetric polishing resulting in misalignment between masking levels.

16. The method of claim 11, wherein said material layer is composed of any material used in the fabrication of semiconductor devices.

17. The method of claim 11, wherein said algorithm that generates said family of lines that converge to said common point, wherein said common point is within a required alignment tolerance.

18. The method of claim 11, wherein said permanent memory is a magnetic storage device.

19. The method of claim 11, wherein said photomask is also used to expose and develop said photoresist layer to form photoresist patterns for making semiconductor devices.

20. Novel alignment marks on a substrate and an algorithm for aligning said substrate to a photomask in a photoresist exposure tool comprising the steps of:

said substrate having at least two said alignment marks triangular in shape recessed in said substrate near the perimeter;

a material layer that can have an asymmetric profile over said recessed alignment marks in said substrate;

a photoresist layer formed on said material layer;

said algorithm encoded in permanent memory for said exposure tool that detects the edges of said recessed triangular alignment marks and mathematically defines three lines parallel to said edges of said triangular alignment mark; and further, said algorithm generates a family of lines moving inward from said edges of said triangular alignment marks and parallel to said edges until said lines converge to a common point which determines the alignment center for said triangular alignment marks;

said algorithm uses the coordinates of said alignment center to position said substrate in said exposure tool to said photomask for exposing said photoresist, wherein said alignment mark and said algorithm minimize misalignment due to asymmetric formation of said material layer over said alignment marks.

21. The structure of claim 20, wherein said alignment marks are equilateral triangles in shape.

22. The structure of claim 20, wherein said algorithm is encoded on a magnetic storage device.

23. The structure of claim 20, wherein said algorithm is encoded in a read-only memory (ROM).

24. The structure of claim 20, wherein said algorithm is encoded in a non-volatile memory comprised of an electrically programmable read-only memory (EPROM).

* * * * *